United States Patent
Tei et al.

(10) Patent No.: US 12,283,786 B2
(45) Date of Patent: Apr. 22, 2025

(54) GAS LASER APPARATUS AND ELECTRONIC DEVICE MANUFACTURING METHOD

(71) Applicant: Gigaphoton Inc., Tochigi (JP)

(72) Inventors: Daisuke Tei, Oyama (JP); Keita Kouzai, Oyama (JP)

(73) Assignee: Gigaphoton Inc., Tochigi (JP)

( * ) Notice: Subject to any disclaimer, the term of this patent is extended or adjusted under 35 U.S.C. 154(b) by 209 days.

(21) Appl. No.: 18/063,965

(22) Filed: Dec. 9, 2022

(65) Prior Publication Data

US 2023/0108886 A1 Apr. 6, 2023

Related U.S. Application Data

(63) Continuation of application No. PCT/JP2020/026495, filed on Jul. 6, 2020.

(51) Int. Cl.
| | |
|---|---|
| *G03F 7/20* | (2006.01) |
| *H01S 3/034* | (2006.01) |
| *H01S 3/06* | (2006.01) |

(52) U.S. Cl.
CPC ............ *H01S 3/034* (2013.01); *G03F 7/2006* (2013.01); *H01S 3/0621* (2013.01)

(58) Field of Classification Search
CPC .... H01S 3/034; H01S 3/0621; H01S 3/08004; H01S 3/08009; H01S 3/137; H01S 3/2251; H01S 3/225; G03F 7/2006
See application file for complete search history.

(56) References Cited

U.S. PATENT DOCUMENTS

| | | | |
|---|---|---|---|
| 2008/0013589 A1 | 1/2008 | Melchior et al. | |
| 2010/0275845 A1* | 11/2010 | Kogure | H01L 21/67115 |
| | | | 220/663 |

(Continued)

FOREIGN PATENT DOCUMENTS

| | | |
|---|---|---|
| CN | 101275063 A | 10/2008 |
| CN | 103257449 A | 8/2013 |

(Continued)

OTHER PUBLICATIONS

International Search Report issued in PCT/JP2020/026495; mailed Sep. 8, 2020.

(Continued)

*Primary Examiner* — Mesfin T Asfaw
(74) *Attorney, Agent, or Firm* — Studebaker Brackett PLLC

(57) ABSTRACT

A gas laser apparatus includes an enclosure, a window holder, a window, and a sealing member. The window holder further having an extending surface located on the side toward which reflected light travels, the reflected light being reflected off the window, the extending surface being continuous with the end surface and extending in a direction away from the window, the extending surface irradiated with the reflected light. A line is obtained by symmetrically folding back the optical axis of the reflected light at the position, on the extending surface, that is irradiated with the reflected light with respect to a reference line passing through the irradiated position and perpendicular to the extending surface. The line 602 extends across a normal to the window in the direction from the extending surface toward the window from the side facing the outer circumference of the window toward the center axis of the window.

18 Claims, 7 Drawing Sheets

(56) References Cited

U.S. PATENT DOCUMENTS

| | | |
|---|---|---|
| 2013/0215487 A1 | 8/2013 | Konuma et al. |
| 2014/0286366 A1* | 9/2014 | Kumazaki ............... H01S 3/034 372/38.05 |
| 2015/0188277 A1 | 7/2015 | Nowak et al. |

FOREIGN PATENT DOCUMENTS

| | | |
|---|---|---|
| CN | 107017544 A | 8/2017 |
| JP | H01-231017 A | 9/1989 |
| JP | H05-003354 A | 1/1993 |
| JP | H06-029160 U | 4/1994 |
| JP | H07-211959 A | 8/1995 |
| JP | H08-148738 A | 6/1996 |
| JP | 2002-043658 A | 2/2002 |
| JP | 2005-268741 A | 9/2005 |
| JP | 2009-164371 A | 7/2009 |
| WO | 2014/045889 A1 | 3/2014 |

OTHER PUBLICATIONS

Written Opinion of the International Searching Authority issued in PCT/JP2020/026495; mailed Sep. 8, 2020.

An Office Action issued by the Japanese Patent Office on Mar. 26, 2024, which corresponds to Japanese Patent Application 2022-534517 and is related to U.S. Appl. No. 18/063,965. (All references cited in the Japanese Office Action were previously cited in U.S. Appl. No. 18/063,965, filed Mar. 6, 2023.).

An Office Action; mailed by the China National Intellectual Property Administration of the People's Republic of China on Sep. 14, 2024, which corresponds to Chinese Patent Application No. 202080101915.5 and is related to U.S. Appl. No. 18/063,965.

An Office Action issued by the Japanese Patent Office on Aug. 13, 2024, which corresponds to Japanese Patent Application 2022-534517 and is related to U.S. Appl. No. 18/063,965.

* cited by examiner

GAS LASER APPARATUS AND ELECTRONIC DEVICE MANUFACTURING METHOD

CROSS-REFERENCE TO RELATED APPLICATIONS

The present application is a continuation application of International Application No. PCT/JP2020/026495, filed on Jul. 6, 2020, the entire contents of which are hereby incorporated by reference.

BACKGROUND

1. Technical Field

The present disclosure relates to a gas laser apparatus and an electronic device manufacturing method.

2. Related Art

In recent years, a semiconductor exposure apparatus is required to improve the resolution thereof as semiconductor integrated circuits are increasingly miniaturized and highly integrated. To this end, reduction in the wavelength of light outputted from a light source for exposure is underway. For example, a KrF excimer laser apparatus, which outputs laser light having a wavelength of about 248 nm, and an ArF excimer laser apparatus, which outputs laser light having a wavelength of about 193 nm, are used as a gas laser apparatus for exposure.

The light from spontaneously oscillating KrF and ArF excimer laser apparatuses has a wide spectral linewidth ranging from 350 pm to 400 pm. A projection lens made of a material that transmits ultraviolet light, such as KrF and ArF laser light, therefore produces chromatic aberrations in some cases. As a result, the resolution of the projection lens may decrease. To avoid the decrease in the resolution, the spectral linewidth of the laser light outputted from the gas laser apparatus needs to be narrow enough to make the chromatic aberrations negligible. To this end, a line narrowing module (LNM) including a line narrowing element (such as etalon and grating) is provided in some cases in a laser resonator of the gas laser apparatus to narrow the spectral linewidth. A gas laser apparatus providing a narrowed spectral linewidth is hereinafter referred to as a narrowed-line gas laser apparatus.

CITATION LIST

Patent Literature

[PTL 1] JP-A-1-231017
[PTL 2] JP-A-5-3354
[PTL 3] JP-A-8-148738

SUMMARY

A gas laser apparatus according to an aspect of the present disclosure includes an enclosure having an internal space where light is generated by laser gas excitation and a hole via which the light from the internal space exits, a tubular window holder disposed at the enclosure and including a hollow section through which the light that exits via the hole passes, a window through which the light traveling through the hollow section passes and which is held by the window holder with a surface on which the light traveling through the hollow section is incident inclining with respect to an optical axis of the light, and a ring-shaped sealing member disposed between the window and an end surface, of the window holder, located so as to face the window, the sealing member being in close contact with the window and the end surface, the sealing member surrounding an opening that is surrounded by the end surface and communicates with the hollow section. The window holder further has an extending surface that is located on a side toward which reflected light travels, the reflected light being a part of the light traveling to the window via the opening and reflected off the window, the extending surface being continuous with the end surface and extending in a direction away from the window, the extending surface irradiated with the reflected light from the window, and a line that is the optical axis of the reflected light symmetrically folded back at a position, on the extending surface, that is irradiated with the reflected light with respect to a reference line passing through the irradiated position and perpendicular to the extending surface, the line extending across a normal to the window in a direction from the extending surface toward the window from a side facing an outer circumference of the window toward a center axis of the window.

An electronic device manufacturing method according to an aspect of the present disclosure includes causing laser light outputted from a gas laser apparatus to enter an exposure apparatus, the gas laser apparatus including an enclosure having an internal space where light is generated by laser gas excitation and a hole via which the light from the internal space exits, a tubular window holder disposed at the enclosure and including a hollow section through which the light that exits via the hole passes, a window through which the light traveling through the hollow section passes and which is held by the window holder with a surface on which the light is incident inclining with respect to an optical axis of the light traveling through the hollow section, and a ring-shaped sealing member disposed between the window and an end surface, of the window holder, located so as to face the window, the sealing member being in close contact with the window and the end surface, the sealing member surrounding an opening that is surrounded by the end surface and communicates with the hollow section, the window holder further having an extending surface that is located on a side toward which reflected light travels, the reflected light being a part of the light traveling to the window via the opening and reflected off the window, the extending surface being continuous with the end surface and extending in a direction away from the window, the extending surface irradiated with the reflected light from the window, and a line that is the optical axis of the reflected light symmetrically folded back at a position, on the extending surface, that is irradiated with the reflected light with respect to a reference line passing through the irradiated position and perpendicular to the extending surface, the line extending across a normal to the window in a direction from the extending surface toward the window from a side facing an outer circumference of the window toward a center axis of the window, and causing a light sensitive substrate to be exposed to the laser light in the exposure apparatus to manufacture electronic devices.

BRIEF DESCRIPTION OF THE DRAWINGS

Embodiments of the present disclosure will be described below only by way of example with reference to the accompanying drawings.

DETAILED DESCRIPTION

Figure 1:
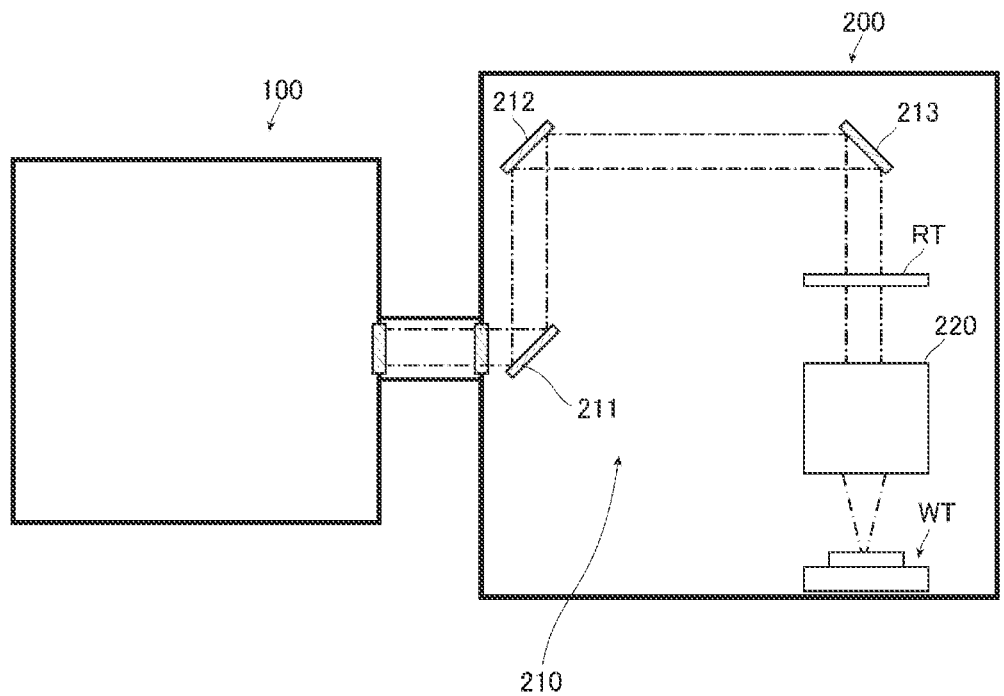
FIG. 1 is a diagrammatic view showing a schematic configuration example of an entire electronic device manufacturing apparatus.

1. Description of electronic device manufacturing apparatus used in electronic device exposure step
2. Description of gas laser apparatus according to Comparative Example
 2.1 Configuration
 2.2 Operation
 2.3 Problems
3. Description of gas laser apparatus according to first embodiment
 3.1 Configuration
 3.2 Function
 3.3 Effects and advantages
4. Description of gas laser apparatus according to second embodiment
 4.1 Configuration
 4.2 Effects and advantages
5. Description of gas laser apparatus according to third embodiment
 5.1 Configuration
 5.2 Effects and advantages
6. Description of gas laser apparatus according to fourth embodiment
 6.1 Configuration
 6.2 Effects and advantages
7. Description of gas laser apparatus according to fifth embodiment
 7.1 Configuration
 7.2 Effects and advantages Embodiments of the present disclosure will be described below in detail with reference to the drawings.

The embodiments described below show some examples of the present disclosure and are not intended to limit the contents of the present disclosure. Further, all configurations and operations described in the embodiments are not necessarily essential as configurations and operations in the present disclosure. The same component has the same reference character, and no redundant description of the same component will be made.

1. Description of Electronic Device Manufacturing Apparatus Used in Electronic Device Exposure Step FIG. 1 is a diagrammatic view showing a schematic configuration example of an entire electronic device manufacturing apparatus used in an electronic device exposure step. The manufacturing apparatus used in the exposure step includes a gas laser apparatus 100 and an exposure apparatus 200, as shown in FIG. 1. The exposure apparatus 200 includes an illumination optical system 210, which includes a plurality of mirrors 211, 212, and 213, and a projection optical system 220. The illumination optical system 210 illuminates a reticle pattern on a reticle stage RT with laser light having entered the exposure apparatus 200 from the gas laser apparatus 100. The projection optical system 220 performs reduction projection on the laser light having passed through the reticle to bring the laser light into focus on a workpiece that is not shown but is placed on a workpiece table WT. The workpiece is a light sensitive substrate onto which a photoresist has been applied, such as a semiconductor wafer. The exposure apparatus 200 translates the reticle stage RT and the workpiece table WT in synchronization with each other to expose the workpiece to the laser light having reflected the reticle pattern. Semiconductor devices that are electronic devices can be manufactured by transferring a device pattern onto the semiconductor wafer in the exposure step described above.

2. Description of Gas Laser Apparatus According to Comparative Example

2.1 Configuration

The gas laser apparatus 100 according to Comparative Example will be described. Comparative Example in the present disclosure is a form that the applicant is aware of as known only by the applicant, and is not a publicly known example that the applicant is self-aware of.

Figure 2:
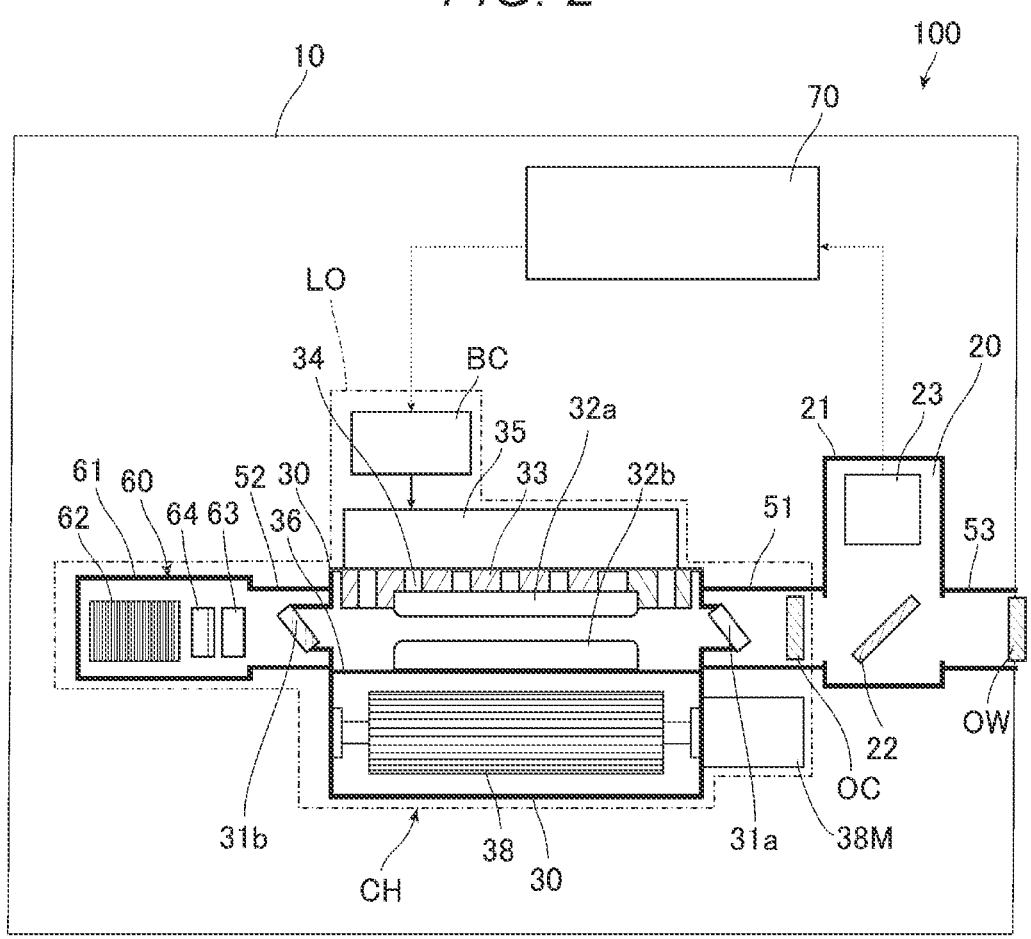
FIG. 2 is a diagrammatic view showing a schematic configuration example of an entire gas laser apparatus.

FIG. 2 is a diagrammatic view showing a schematic configuration example of the entire gas laser apparatus 100 according to Comparative Example. The gas laser apparatus 100 according to Comparative Example includes an enclosure 10, a laser oscillator LO, a wavelength measuring module 20, and a processor 70 as primary components, as shown in FIG. 2. The gas laser apparatus 100 according to Comparative Example is an ArF excimer laser apparatus using a mixture gas containing, for example, argon (Ar), fluorine ($F_2$), and neon (Ne). In this case, the gas laser apparatus 100 outputs pulse laser light having a center wavelength of about 193 nm. The gas laser apparatus 100 may instead be a gas laser apparatus other than an ArF excimer laser apparatus, for example, a KrF excimer laser apparatus using a mixture gas containing krypton (Kr), fluorine ($F_2$), and neon (Ne). In this case, the gas laser apparatus 100 outputs pulse laser light having a center wavelength of about 248 nm. The mixture gas containing Ar, $F_2$, and Ne and the mixture gas containing Kr, $F_2$, and Ne, the constituent elements forming a laser medium, are each referred to as a laser gas in some cases.

The processor 70 in the present disclosure is a processing apparatus including a storage apparatus that stores a control program, and a CPU that executes the control program. The processor 70 is particularly configured or programmed to carry out a variety of processes contained in the present disclosure. The processor 70 controls some of the components of the gas laser apparatus 100. The processor 70 further controls the entire gas laser apparatus 100.

The laser oscillator LO includes a chamber apparatus CH, a charger BC, a line narrowing module 60, and an output coupling mirror OC, as primary components.

The chamber apparatus CH includes an enclosure 30, a pair of windows 31a and 31b, a pair of window holders 300a and 300b, which will be described later, a pair of sealing members 400a and 400b, which will be described later, a pair of fixing units 500a and 500b, which will be described later, a pair of electrodes 32a and 32b, an insulating section 33, a pulse power module 35, an electrode holder 36, a crossflow fan 38, and a motor 38M as primary components.

The windows 31a and 31b are provided in the enclosure 30 in positions facing each other. The window 31a is located at one end of the enclosure 30 in the traveling direction of the laser light, and the window 31b is located at the other end of the enclosure 30 in the traveling direction of the laser light. The gas laser apparatus 100 outputs the laser light as a result of optical oscillation that occurs on the optical path on which the enclosure 30 is disposed, so that the laser light generated in an internal space of the enclosure 30 exits out of the enclosure 30 via the windows 31a and 31b, as will be described later. The windows 31a and 31b are each tilted to form a Brewster angle with respect to the traveling direction of the laser light so that reflection of a P-polarized component of the laser light that occurs at the window is suppressed.

The enclosure 30 has the internal space where the laser gas described above is excited to generate light. The laser gas is supplied to the internal space of the enclosure 30 from a laser gas supply source that is not shown but is located in the enclosure 10 via a pipe that is not shown. In Comparative Example, since the gas laser apparatus 100 is an ArF excimer laser apparatus, the laser gas supply source supplies, for example, the mixture gas containing Ar, $F_2$, and Ne to the internal space of the enclosure 30. When the gas laser apparatus 100 is formed of a KrF excimer laser, the laser gas supply source supplies, for example, the mixture gas containing Kr, $F_2$, and Ne to the internal space of the enclosure 30. The aforementioned light generated by the excitation of the laser gas exits via a hole 30a, which will be described later, of the enclosure 30 and passes through a hollow portion of each of the window holders 300a and 300b, which each have a tubular shape, and travels to the windows 31a and 31b.

The longitudinal direction of the pair of electrodes 32a and 32b extends along the traveling direction of the laser light, and the pair of electrodes 32a and 32b are arranged so as to face each other in the internal space of the enclosure 30. A space between the electrodes 32a and 32b in the enclosure 30 is sandwiched between the windows 31a and 31b. The electrodes 32a and 32b are each a discharge electrode configured to produce glow discharge that excites the laser medium. In Comparative Example, the electrode 32a is the cathode, and the electrode 32b is the anode.

An opening is formed in the enclosure 30, and the opening is closed by the insulating section 33 including an insulator. The electrode 32a is supported by the insulating section 33. A feedthrough section 34 formed of a conductive member is buried in the insulating section 33. The feedthrough section 34 applies a voltage supplied from the pulse power module 35 to the electrode 32a. The electrode 32b is supported by the electrode holder 36 and electrically connected to the electrode holder 36. The electrode holder 36 is electrically connected to the enclosure 30 via wiring that is not shown.

The charger BC disposed outside the enclosure 30 is connected to the pulse power module 35. The charger BC is a DC power supplier that charges, by using a predetermined voltage, a capacitor that is not shown in but is provided in the pulse power module 35. The pulse power module 35 includes a switch controlled by the processor 70. When the switch in the off state is turned on, the pulse power module 35 boosts the voltage applied from the charger BC to generate a pulse-shaped high voltage and applies the high voltage to the pair of electrodes 32a and 32b.

The crossflow fan 38 is disposed in the internal space, of the enclosure 30, that is on a side across the electrode holder 36 from the electrode 32b. A space in the internal space of the enclosure 30 where the crossflow fan 38 is disposed communicates with the space between the pair of electrodes 32a and 32b in the internal space of the enclosure 30. The laser gas encapsulated in the internal space of the enclosure 30 therefore circulates in a predetermined direction when the crossflow fan 38 rotates. The motor 38M disposed outside the enclosure 30 is connected to the crossflow fan 38. The rotation produced by the motor 38M rotates the crossflow fan 38. The motor 38M is turned on and off and the rotational speed thereof is adjusted under the control of the processor 70. The processor 70 can therefore adjust the circulation speed of the laser gas circulating in the internal space of the enclosure 30 by controlling the motor 38M.

A heat exchanger that is not shown is disposed next to the crossflow fan 38. At least part of the laser gas circulated by the crossflow fan 38 passes through the heat exchanger, which adjusts the temperature of the laser gas.

An optical path tube 51 is connected to the one end of the enclosure 30, which is the end where the window 31a is provided. The output coupling mirror OC is provided on the side facing the one end of the enclosure 30 as a reference and disposed in an internal space of the optical path tube 51. The output coupling mirror OC is an optical element on which the laser light that exits via the window 31a is incident and transmits part of the light that exits via the window 31a and reflects the other part of the light back into the internal space of the enclosure 30 via the window 31a. The output coupling mirror OC is formed, for example, of an element including a calcium fluoride substrate on which a dielectric multilayer film is deposited. A film that partially reflects the laser light may be deposited on the surface of the output coupling mirror OC.

An optical path tube 52 is connected to the other end, of the enclosure 30, where the window 31b is provided. The line narrowing module 60 is connected to the optical path tube 52. The line narrowing module 60 is provided at the other end described above of the enclosure 30 as the reference, that is, the side across the enclosure 30 from the output coupling mirror OC. The line narrowing module 60 includes an enclosure 61, a grating 62, and prisms 63 and 64. An opening is formed in the enclosure 61, and an internal space of the enclosure 61 and an internal space of the optical path tube 52 communicate with each other via the opening.

The grating 62 and the prisms 63 and 64 are disposed in the internal space of the enclosure 61. The grating 62 and the prisms 63 and 64 are optical elements on which the laser light that exits via the window 31b is incident. The grating 62 is disposed in the Littrow arrangement, which causes the angle of incidence of the laser light incident on the grating 62 to be substantially equal to the angle of diffraction of the light diffracted by the grating 62. In Comparative Example, the grating 62 may instead be an echelle grating blazed with respect to the wavelength of about 193 nm. The grating 62 is fixed to the enclosure 61 and therefore does not move relative to the enclosure 61.

At least one of the prisms 63 and 64 is fixed onto a rotary stage that is not shown but is disposed in the internal space of the enclosure 61. One of the prisms 63 and 64 that is fixed onto the rotary stage is slightly rotated to adjust the angle of incidence of the light incident on the grating 62. Adjusting the angle of incidence of the light incident on the grating 62 adjusts the wavelength of the light reflected off the grating 62 and entering the chamber apparatus CH. The wavelength of the light returning to the enclosure 30 is therefore adjusted to a desired wavelength when the light that exits via the window 31b of the enclosure 30 is reflected off the grating 62 via the prisms 63 and 64. The prisms 63 and 64 are made, for example, of calcium fluoride. The number of prisms disposed in the line narrowing module 60 is two in Comparative Example and may instead be one or three or more.

A laser resonator is formed by the output coupling mirror OC and the grating 62 so provided as to sandwich the enclosure 30, and the enclosure 30 is disposed on the optical path of the laser resonator. The light that exits out of the internal space of the enclosure 30 via the hole of the enclosure 30, which will be described below, travels back and forth between the grating 62 in the line narrowing module 60 and the output coupling mirror OC via the windows 31a and 31b and the prisms 63 and 64. The light traveling back and force is amplified whenever passing through the laser gain space between the electrodes 32a and 32b. Part of the amplified light passes through the output coupling mirror OC via the window 31a and exits as the pulse laser light.

The wavelength measuring module 20 is disposed on the optical path of the pulse laser light that exits via the output coupling mirror OC of the laser oscillator LO. The wavelength measuring module 20 includes an enclosure 21, a beam splitter 22, and a wavelength monitor 23. The enclosure 21 is connected to the optical path tube 51. An opening is formed in the enclosure 21, and an internal space of the enclosure 21 and the internal space of the optical path tube 51 communicate with each other via the opening. The beam splitter 22 and the wavelength monitor 23 are disposed in the internal space of the enclosure 21. The beam splitter 22 and the wavelength monitor 23 are optical elements on which the pulse laser light that exits via the output coupling mirror OC is incident.

The beam splitter 22 transmits the pulse laser light outputted from the laser oscillator LO at high transmittance and reflects part of the pulse laser light toward the light receiving surface of the wavelength monitor 23. The wavelength monitor 23 detects the wavelength of the pulse laser light incident on the light receiving surface and outputs data on the detected wavelength to the processor 70.

An opening is formed on the side, of the enclosure 21 of the wavelength measuring module 20, across the enclosure 21 from the side to which the optical path tube 51 is connected, and an optical path tube 53 is connected to the enclosure 21 so as to surround the opening. The internal space in the optical path tube 51, the internal space in the enclosure 21, and an internal space in the optical path tube 53 therefore communicate with each other. The optical path tube 53 is connected to the enclosure 10. A laser light exiting window OW is provided in the enclosure 10 at the position thereon surrounded by the optical path tube 53. The light passing through the beam splitter 22 of the wavelength measuring module 20 therefore exits out of the enclosure 10 through the optical path tube 53 and via the laser light exiting window OW.

The internal spaces of the optical path tubes 51, 52, and 53 and the enclosures 21 and 61 are filled with a purge gas. The purge gas contains an inert gas, such as high-purity nitrogen having a small amount of impurities, such as oxygen. The purge gas is supplied from a purge gas supply source that is not shown but is disposed outside the enclosure 10 into the internal spaces of the optical path tubes 51, 52, and 53 and the enclosures 21 and 61 through a pipe that is not shown.

A discharge apparatus that is not shown is disposed in the internal space of the enclosure 10 and discharges the laser gas discharged from the internal space of the enclosure 30 of the chamber apparatus CH. The discharge apparatus includes a halogen filter that removes the $F_2$ gas from the gas discharged from the internal space of the enclosure 30, and the discharge apparatus then outputs the resultant gas into the enclosure 10.

Figure 3:
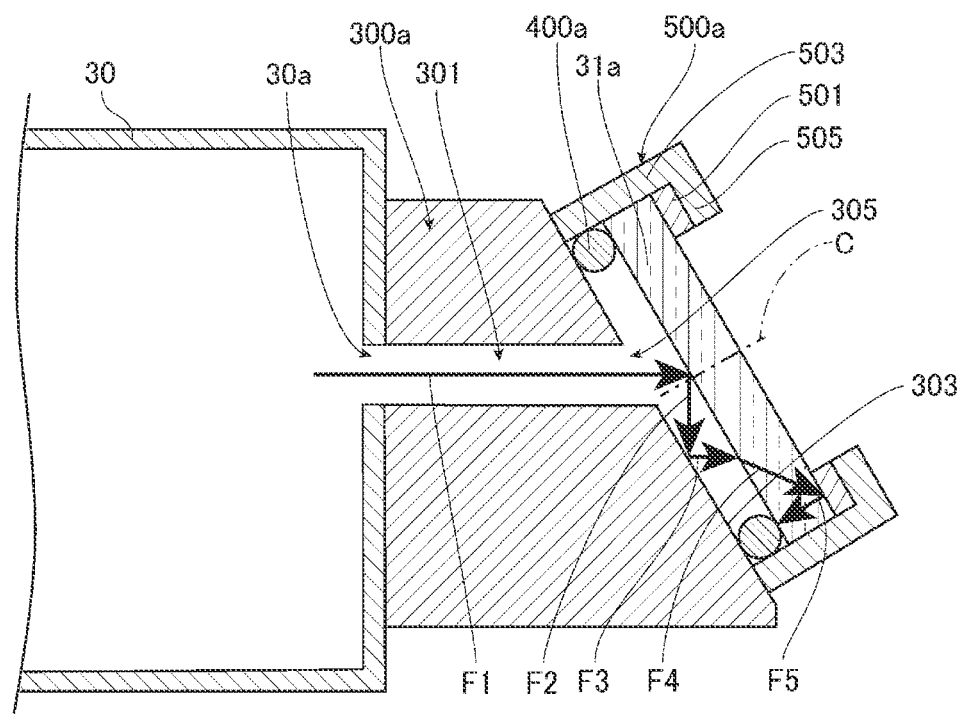
FIG. 3 shows an example of schematic configurations of a window, a window holder, and therearound on the side facing an output coupling mirror in Comparative Example.

The configurations of the window 31a and the window holder 300a in Comparative Example will next be described with reference to FIG. 3. FIG. 3 shows an example of schematic configurations of the window 31a and the window holder 300a in Comparative Example. In FIG. 3, the window 31a and the window holder 300a are each shown in the form of vertical cross-section. In FIG. 3, a solid-line arrow F1 shows light traveling from the internal space of the enclosure 30 to the window 31a via the hole 30a of the enclosure 30, a hollow section 301, and an opening 305.

The window holder 300a has a tubular shape and is located between the aforementioned one end of the enclosure 30 and the window 31a. In FIG. 3, one end of the window holder 300a is connected to the wall surface of the enclosure 30, and the other end of the window holder 300a is located on the side facing the window 31a.

The tubular window holder 300a has the hollow section 301 and an end surface 303 located at the other end of the window holder 300a.

The hollow section 301 communicates with the internal space of the enclosure 30 via the hole 30a of the enclosure 30. The hollow section 301 further communicates with the opening 305 located at the end surface 303. The light traveling from the internal space of the enclosure 30 toward the output coupling mirror OC via the hole 30a of the enclosure 30, the opening 305, and the window 31a passes through the hollow section 301. The light traveling in the direction opposite the traveling direction described above, that is, traveling from the output coupling mirror OC to the internal space of the enclosure 30 also passes through the hollow section 301. The opening 305 is therefore not only an outlet via which the light exits to the output coupling mirror OC but an inlet via which the light enters the hollow section 301.

The end surface 303 faces the window 31a. The end surface 303 is further parallel to the surface, which faces the end surface 303, of the window 31a. The surface described above is hereinafter referred in some cases to as a laser-gas-side surface in contact with the laser gas. The opening 305 is also parallel to the surface of the window 31a, as the end surface 303 is. The end surface 303 is a flat surface. The window 31a is located in a plane having an area where the end surface 303 is projected toward the window 31a along a straight line perpendicular to the end surface 303.

The window 31a is a plane parallel substrate. The window 31a is made of calcium fluoride. The window 31a may instead be a parallel wedge substrate. The window 31a may instead be made of a material having high transmittance of light that belongs to the ultraviolet region, such as magnesium fluoride, fused quartz, and synthetic quartz.

The window 31a is so disposed that the light traveling through the hollow section 301 is incident on the window 31a at a predetermined angle. The angle is the Brewster angle or thereabouts, for example, ranging from 55° to 61°. The window 31a is held by the window holder 300a with the surface, of the window 31a, on which the light indicated by the solid-line arrow F1 and traveling through the hollow section 301 is incident, inclining with respect to the optical axis of the light.

The sealing member 400a and the fixing unit 500a are disposed around the window 31a and at the periphery of the window holder 300a, as shown in FIG. 3. The configurations of the sealing member 400a, which is a ring-shaped member, and the fixing unit 500a will be described below.

The sealing member 400a is disposed between the end surface 303 and the window 31a with the sealing member 400a sandwiched between the end surface 303 and the window 31a. The sealing member 400a is disposed so as to surround a center axis C of the window 31a and the opening 305 at the end surface 303. The inner diameter of the sealing member 400a is therefore greater than the diameter of the opening 305 at the end surface 303. The outer diameter of the sealing member 400a is approximately equal to the outer diameter of the window 31a, and the sealing member 400a is disposed along the outer circumferential edge of the surface, of the window 31a, that is in contact with the laser gas. The sealing member 400a is an O-ring made of nitrile rubber or other resin. The sealing member 400a only needs to be disposed so as to surround the opening 305 at the end surface 303. For example, the outer diameter of the sealing member 400a may be smaller than the outer diameter of the window 31a, and the sealing member 400a may be disposed between the opening 305 and the outer circumferential edge of the window 31a.

The sealing member 400a is in intimate contact with the surface of the window 31a and the end surface 303 of the window holder 300a. It can therefore be understood that the window holder 300a holds the window 31a at the end surface 303 via the sealing member 400a. The sealing member 400a seals the space between the surface of the window 31a and the end surface 303 of the window holder 300a through the intimate contact therewith. The laser gas is thus encapsulated in the internal space of the enclosure 30, in the hollow section 301, and in a space between the end surface 303 and the window 31a.

The fixing unit 500a fixes the sealing member 400a and the window 31a to the window holder 300a. The fixing unit 500a includes a ring member 501 and a fixing member 503.

The ring member 501 is disposed at the surface, of the window 31a, that is opposite from the sealing member 400a, and surrounds the center axis C of the window 31a. The surface described above is hereinafter referred in some cases to as a purge-gas-side surface in contact with the purge gas. The inner diameter of the ring member 501 is approximately equal to the inner diameter of the sealing member 400a, and the outer diameter of the ring member 501 is approximately equal to the outer diameter of the sealing member 400a. The ring member 501 is disposed along the outer circumferential edge of the surface, of the window 31a, that is in contact with the purge gas. Therefore, the ring member 501 is disposed on the side across the window 31a from the sealing member 400a, and the window 31a is sandwiched between the sealing member 400a and the ring member 501. The center axes of the ring member 501, the window 31a, and the sealing member 400a are arranged coaxially with one another.

The fixing member 503 has a tubular shape. The inner diameter of the fixing member 503 is approximately equal to the outer diameter of each of the window 31a, the sealing member 400a, and the ring member 501. The fixing member 503 surrounds the entire outer circumferential surfaces of the window 31a, the sealing member 400a, and the ring member 501, and is in contact with the outer circumferential surfaces thereof. The fixing member 503 may instead be in intimate contact with the outer circumferential surfaces of the window 31a, the sealing member 400a, and the ring member 501. The center axis of the fixing member 503 is coaxial with the center axis C of the window 31a. The fixing member 503, which surrounds the entire outer circumferential surfaces of the window 31a, the sealing member 400a, and the ring member 501, is attached to the end surface 303 at one end of the fixing member 503.

The fixing member 503 includes a ring-shaped inner flange 505, which is disposed at the other end of the fixing member 503. The inner flange 505 is disposed along the entire inner circumferential surface of the fixing member 503. The inner flange 505 extends from the inner circumferential surface of the fixing member 503 in the radial direction of the fixing member 503 toward the center of the fixing member 503. The inner diameter of the inner flange 505 is approximately equal to the inner diameter of the ring member 501.

When the fixing member 503 is attached to the end surface 303, the inner flange 505 presses the ring member 501 toward the window 31a. As a result, the window 31a is pressed toward the end surface 303 via the sealing member 400a and fixed to the window 31a in the axial and radial directions thereof. The fixing member 503 is in contact with the outer circumferential surface of the window 31a and therefore fixes the window 31a in the radial direction thereof.

The sealing member 400a is elastically deformed when pressed, and the elastic deformation causes the surfaces of the sealing member 400a that are in intimate contact with the window 31a and the end surface 303 to be wider than before pressed. The sealing member 400a is thus in more intimate contact with the window 31a and the end surface 303 than before pressed, and the more intimate contact allows the space between the laser-gas-side surface of the window 31a and the end surface 303 of the window holder 300a to be sealed by a greater degree.

The window holder 300a and the ring member 501 are made of metal. The metal is, for example, stainless steel such as SUS 304, SUS 316, or SUS 303. The end surface 303, of the window holder 300a, which faces the window 31a, and the surface, of the ring member 501, that is in contact with the window 31a are mirror-polished.

Figure 4:
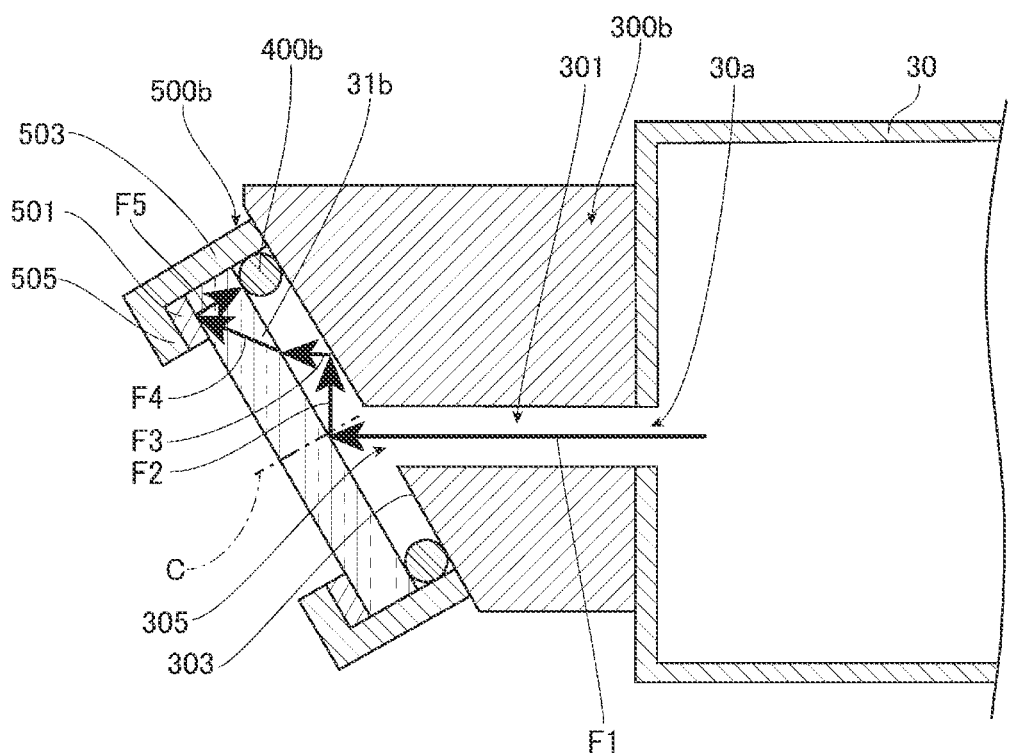
FIG. 4 shows an example of schematic configurations of the window, the window holder, and therearound on the side facing a line narrowing module in Comparative Example.

The configurations of the window 31b, the window holder 300b, the sealing member 400b, and the fixing unit 500b are the same as those of the window 31a, the window holder 300a, the sealing member 400a, and the fixing unit 500a, respectively. The arrangement of the window holder 300b with respect to the enclosure 30 will not be described in detail because the arrangement is the same as the arrangement of the window holder 300a with respect to the enclosure 30, except that the window holder 300b is disposed at the aforementioned other end of the enclosure 30 and that the window holder 300b is disposed as inverting the window holder 300a upside down with respect to the optical axis of the light labeled with the arrow F1, as shown in FIG. 4.

2.2 Operation

The operation of the gas laser apparatus 100 according to Comparative Example will next be described.

In the state before the gas laser apparatus 100 outputs the laser light, the internal spaces of the optical path tubes 51, 52, and 53 and the internal spaces of the enclosures 21 and 61 are filled with the purge gas from the purge gas supply source, which is not shown. The laser gas supply source, which is not shown, supplies the internal space of the enclosure 30 with the laser gas. When the laser gas is supplied, the processor 70 controls the motor 38M to rotate the crossflow fan 38, and the rotation of the crossflow fan 38 circulates the laser gas.

When the gas laser apparatus 100 outputs the laser light, the processor 70 controls the charger BC and the switch in the pulse power module 35 to apply the high voltage to the space between the electrodes 32a and 32b. When the high voltage is applied to the space between the electrodes 32a and 32b, the insulation between the electrodes 32a and 32b is broken down and discharge occurs. The energy of the discharge excites the laser medium contained in the laser gas between the electrodes 32a and 32b, and the excited laser medium emits spontaneously emitted light when returning to the ground state. Part of the light is ultraviolet light, which exits out of the enclosure 30, and passes through the window 31b via the hollow section 301 and the opening 305 of the window holder 300b. The light having passed through the window 31b passes through the prisms 63 and 64, which magnify the light in the traveling direction of the light, and guide the light to the grating 62. The light undergoes wavelength dispersion whenever passing through the prisms 63 and 64. The light is then incident on the grating 62 at a predetermined angle and diffracted by the grating 62, and light having a predetermined wavelength is reflected off the grating 62 at an angle of reflection equal to the angle of incidence. The light reflected off the grating 62 passes through the prisms 63 and 64, and propagates into the internal space of the enclosure 30 again via the window 31b, the opening 305 and the hollow section 301 of the window holder 300b, and the hole 30a of the enclosure 30. The linewidth of the light propagating into the internal space of the enclosure 30 has been narrowed by the line narrowing module 60. The narrowed-line light causes the excited laser medium to undergo stimulated emission, which amplifies the light. The light exits via the hole 30a in the enclosure 30, passes through the window 31a via the hollow section 301 and the opening 305 of the window holder 300a, and travels to the output coupling mirror OC. Part of the light passes through the output coupling mirror OC, and the remainder of the light is reflected off the output coupling mirror OC and propagates into the internal space of the enclosure 30 via the window 31a, the opening 305 and the hollow section 301 of the window holder 300a, and the hole 30a of the enclosure 30. The light having propagated into the internal space of the enclosure 30 passes through the window 31b and the prisms 63 and 64 and travels to the grating 62, as described above. The light having the predetermined wavelength thus travels back and forth in the space between the grating 62 and the output coupling mirror OC. The light is thus amplified, and laser oscillation occurs. Part of the laser light then passes through the output coupling mirror OC and exits via the laser light exiting window OW toward the exposure apparatus 200.

Part of the laser light having passed through the output coupling mirror OC is reflected off the beam splitter 22. The reflected laser light is received by the wavelength monitor 23, which outputs a signal based on the intensity of the energy of the received laser light to the processor 70. The processor 70 controls the charger BC and the pulse power module 35 based on the signal to adjust the power of the outputted laser light.

2.3 Problems

In the gas laser apparatus 100 according to Comparative Example, the light travels from the internal space of the enclosure 30 to the window 31a via the hole 30a of the enclosure 30, the hollow section 301, and the opening 305, as indicated by the arrow F1 in FIG. 3. When the light passes through the window 31a, part of the light is reflected off the surface of the window 31a. In FIG. 3, the reflected light travels from the surface of the window 31a, which reflects the light, to the end surface 303, as indicated by an arrow $F_2$, and is reflected off the end surface 303 toward the window 31a, as indicated by a solid-line arrow F3. The reflected light may then pass through the window 31a and travel to the members disposed around the outer circumference of the window 31a. The outer circumference includes the outer circumferential surface of the window 31a, and the outer circumferential edges of the laser-gas-side surface and the purge-gas-side surface of the window 31a. The members are those disposed so as not to block the travel of the light that passes through the window 31a and travels back and forth in the laser resonator, and include the sealing member 400a, the ring member 501, and the fixing member 503. The reflected light may pass through the window 31a and travels to the ring member 501, as indicated by a solid-line arrow F4. The reflected light does not travel to the entire surface of the ring member 501, which is in contact with the purge-gas-side surface of the window 31a, but travels to a portion of the surface, of the ring member 501, located in a reflection-side area. Provided that the ring member 501 is divided into upper and lower semicircular arcuate portions when viewed from the front side, the portion of the surface substantially corresponds to a bottom portion of the lower semicircular arcuate portion. The reflected light may be reflected off the portion of the surface of the ring member 501, pass through the window 31a, and travel to the sealing member 400a, as indicated by a solid-line arrow F5. In this case, the reflected light does not travel to the entire intimate contact surface of the sealing member 400a, which is in intimate contact with the laser-gas-side surface of the window 31a, but travels to a portion of the intimate contact surface, of the sealing member 400a, located in the reflection-side area described above. The portion of the intimate contact surface faces the portion, of the surface of the ring member 501, irradiated with the reflected light.

Note that the reflectance of the surface of the window 31a may be greater than expected, or the intensity of the reflected light may be greater than expected for some reason. In such a case, the sealing member 400a irradiated with the reflected light for a predetermined period or longer has a concern for deterioration occurring earlier than expected, resulting in a decrease in a pre-expected service life of the sealing member 400a. When the service life of the sealing member 400a shortens, the usable period of the gas laser apparatus 100, which represents the interval between the timings of maintenance of the gas laser apparatus 100, may be shorter than expected in advance.

The description has been made about the side facing the window holder 300a, and the same holds true for the side facing the window holder 300b, that is, part of the light traveling from the enclosure 30 to the window 31b via the window holder 300b is reflected off the surface of the window 31b. Since the window holder 300b is disposed as inverting the window holder 300a upside down as described above, the direction in which the light is reflected off the window 31b is opposite the direction in which the light is reflected off the window 31a. The reflected light may travel to the sealing member 400b on the side facing the window holder 300b via the end surface 303 of the window holder 300b and the ring member 501 in the fixing unit 500b on the side facing the window holder 300b, as described above. There is therefore the concern for deterioration of the sealing member 400b occurring earlier than expected, resulting in a decrease in the pre-expected service life of the sealing member 400b, as in the case of the sealing member 400a. When the service life of the sealing member 400b shortens, the usable period of the gas laser apparatus 100 may be shorter than expected in advance.

In view of the situations described above, the following embodiments each illustrate a gas laser apparatus 100 that allows suppression of deterioration of the sealing members 400a and 400b to suppress a decrease in a pre-expected usable period thereof.

The following embodiments and variations thereof will each be described with reference to the window 31a and the window holder 300a facing the output coupling mirror OC, and the window 31b and the window holder 300b facing the grating 62 can also have the same configurations and provide the same effects and advantages, as those of the window 31a and the window holder 300a.

3. Description of Gas Laser Apparatus According to First Embodiment

The gas laser apparatus 100 according to a first embodiment will next be described. The same components as those described above have the same reference characters, and duplicate description of the same components will be omitted unless otherwise particularly described.

3.1 Configuration

Figure 5:
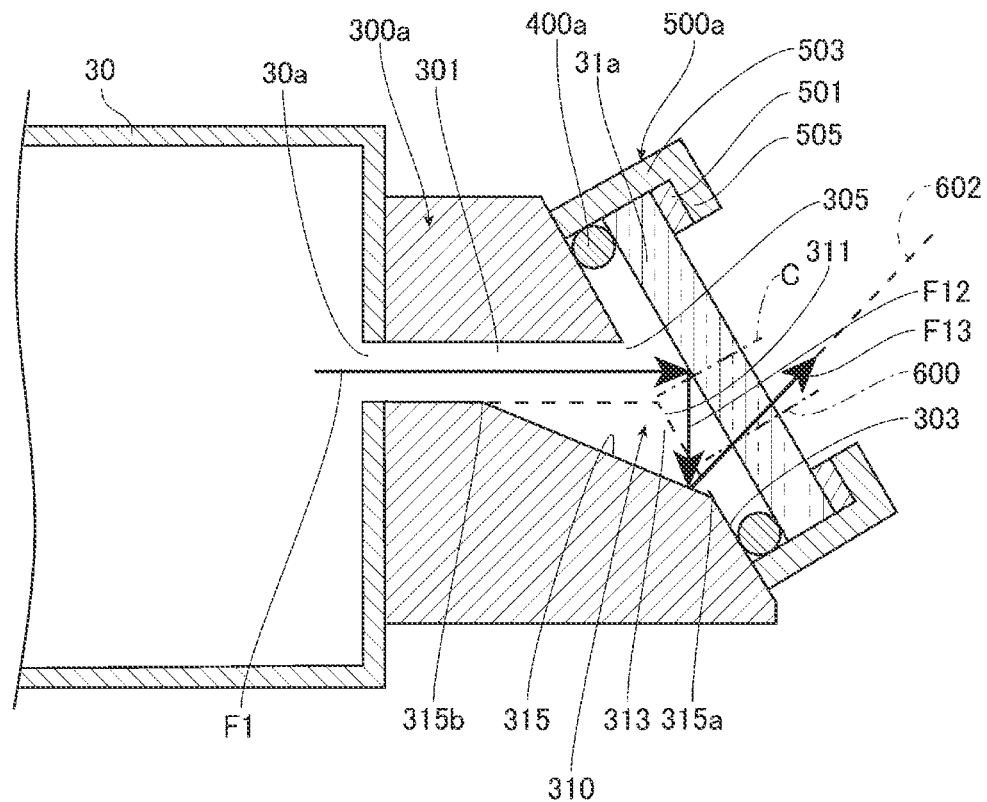
FIG. 5 shows an example of schematic configurations of the window, the window holder, and therearound on the side facing the output coupling mirror in a first embodiment.
Figure 6:
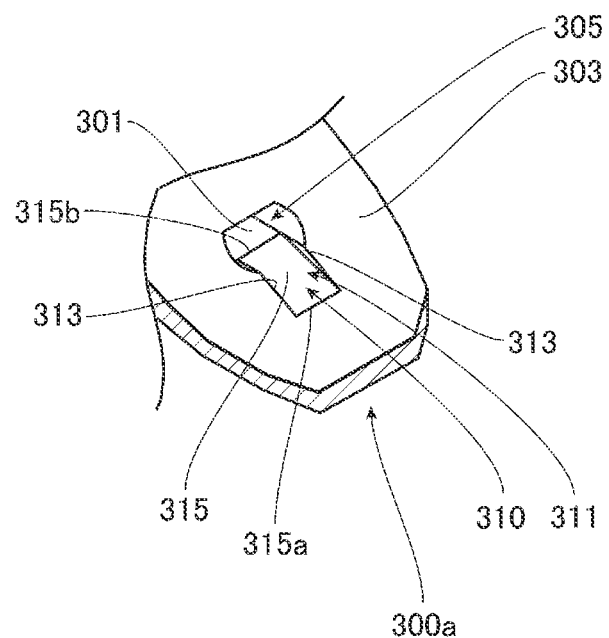
FIG. 6 is a schematic perspective view of the window holder when viewed from the side facing an end surface of the window holder.

FIG. 5 shows an example of schematic configurations of the window 31a, the window holder 300a, and therearound in the present embodiment. In FIG. 5, the window 31a and the window holder 300a are each shown in the form of vertical cross-section. FIG. 6 is a schematic perspective view of the window holder 300a in the present embodiment when viewed from the side facing the end surface 303 of the window holder 300a.

In the gas laser apparatus 100 according to the present embodiment, the window holders 300a and 300b differ from the window holders 300a and 300b in Comparative Example primarily in terms of configuration. In the present embodiment, the configuration of the window holder 300a is the same as that of the window holder 300b. In the present embodiment, the arrangement of the window holder 300b in the present embodiment with respect to the enclosure 30 is the same as the arrangement of the window holder 300a in the present embodiment with respect to the enclosure 30, except that the window holder 300b is disposed at the aforementioned other end of the enclosure 30, and that the window holder 300b is disposed as inverting the window holder 300a upside down with respect to the optical axis of the light labeled with the arrow F1, as in Comparative Example. In the following description, the window holder 300a is used to describe the difference from the window holder 300a in Comparative Example.

The entire end surface 303 of the window holder 300a in Comparative Example is a flat surface parallel to the surface of the window 31a, whereas a continuous depression 310 is formed continuously with the end surface 303 of the window holder 300a in the present embodiment.

The depression 310 is continuously present in the area, of the end surface 303, surrounded by the sealing member 400a. In the area, the depression 310 is located on the side toward which the light having traveled via the opening 305 to the window 31a and having been reflected off the window 31a travels. In FIG. 5, the reflected light is indicated by a solid-line arrow F12. The depression 310 extends from the end surface 303 toward the hollow section 301 and communicates with the hollow section 301.

An opening 311 of the depression 310 is continuous with the opening 305 and surrounded by the sealing member 400a. The opening 311 is parallel to the window 31a.

A pair of side surfaces 313 of the depression 310 are flat inner wall surfaces of the depression 310, are perpendicular to the end surface 303, and face each other. The pair of side surfaces 313 are continuous with the end surface 303 and the inner circumferential surface of the window holder 300a of the hollow section 301.

The depression 310 has an extending surface 315 continuous with the end surface 303 and extending in a direction away from the window 31a. The extending surface 315 is located on the side toward which the light reflected off the window 31a travels, and is a flat bottom surface, of the depression 310, that is directly irradiated with the reflected light from the window 31a.

The extending surface 315 has one end 315a, which is continuous with the end surface 303, and another end 315b, which is continuous with the inner circumferential surface of the hollow section 301 of the window holder 300a. It can therefore be understood that the one end 315a is located in a position away from the optical axis of the light indicated by the solid-line arrow F1, and that the other end 315b is located in a position close to the optical axis of the light indicated by the solid-line arrow F1.

The angle of inclination of the extending surface 315 with respect to the window 31a is greater than the angle of inclination of the end surface 303 with respect to the window 31a. The angle of inclination of the extending surface 315 with respect to the window 31a is the angle formed by the following three points: the other end 315b of the extending surface 315; the intersection of a straight line passing through the other end 315b and the one end 315a of the extending surface 315 and the laser-gas-side surface of the window 31a; and the center of the laser-gas-side surface of the window 31a. The intersection may instead be the intersection of the straight line and an in-plane extension of the laser-gas-side surface. The angle of inclination of the end surface 303 with respect to the window 31a is zero because the end surface 303 is parallel to the window 31a. It can therefore be understood that the other end 315b of the extending surface 315 inclines as a result of rotation of the other end 315b around the one end 315a of the extending surface 315 in the counterclockwise direction, which is the direction away from the window 31a relative to the end surface 303. It can further be understood that the distance between the extending surface 315 and the window 31a gradually increases in the direction from the one end 315a toward the other end 315b. The distance between the one end 315a of the extending surface 315 and the window 31a is equal to the distance between the end surface 303 and the window 31a in the direction along a normal 600, which will be described later, but is shorter than the distance between the other end 315b of the extending surface 315 and the window 31a. The extending surface 315 does not extend in parallel to the optical axis of the light indicated by the solid-line arrow F1, but inclines also with respect to the optical axis.

The window holder 300a in the present embodiment is made of metal such as stainless steel, as the window holder 300a in Comparative Example is. The extending surface 315 therefore reflects the reflected light traveling from the window 31a to the extending surface 315. When the extending surface 315 inclines as described above, the extending surface 315 reflects the reflected light traveling from the window 31a to the extending surface 315 toward the window 31a via the space inside the sealing member 400a. In the present embodiment, the extending surface 315 reflects the reflected light toward the window 31a in the direction from the extending surface 315 toward the window 31a in such a way that the reflected light from the window 31a is incident on the window 31a across the normal 600 to the window 31a from the side facing the outer circumference of the window 31a toward the center axis C of the window 31a. In FIG. 5, the reflected light reflected off the extending surface 315 and incident on the window 31a is indicated by a solid-line arrow F13. The normal 600 described above is one of a plurality of normals to the laser-gas-side surface of the window 31a that passes through the extending surface 315. The intersection of the normal 600 and the extending surface 315 is located between two points: one point located at the reflected light irradiated position on the extending surface 315; and the other point located at the intersection of the normal to the window 31a that passes through the position irradiated with the light indicated by the arrow F1 and the extending surface 315. A line passing through the reflected light irradiated position on the extending surface 315 and the window 31a is now assumed to be a reference line. In the present embodiment, the reference line is a line perpendicular to the extending surface 315. It is further assumed that a line 602 is an imaginary line that is the optical axis of the reflected light symmetrically folded back at the reflected light irradiated position on the extending surface 315 with respect to the reference line. In FIG. 5, the solid-line arrow F13, which indicates the reflected light, overlaps with part of the imaginary line 602. It can be understood that the imaginary line 602 is located so as to extend in the direction from the extending surface 315 toward the window 31a across the normal 600 to the window 31a from the side facing the outer circumference of the window 31a toward the center axis of the window 31a, as the reflected light indicated by the solid-line arrow F13 is.

The width of the extending surface 315 is smaller than the largest width of the opening 305, which has a rounded quadrangular shape, and is equal to the length of the straight section of the rounded quadrangular opening 305, as shown in FIG. 6. The width of the extending surface 315 is also the width of the opening 311 and the distance between the pair of side surfaces 313. The extending surface 315 has, for example, a rectangular shape. The extending surface 315 is perpendicular to the pair of side surfaces 313.

3.2 Function

The function of the extending surface 315 in the present embodiment will next be described.

In the gas laser apparatus 100 according to the present embodiment, the light travels from the internal space of the enclosure 30 to the window 31a via the hole 30a, the hollow section 301, and the opening 305 of the enclosure 30, as indicated by the arrow F1 in FIG. 5, as in the gas laser apparatus 100 according to Comparative Example. When the light passes through the window 31a, part of the light is reflected off the surface of the window 31a, as in Comparative Example. In FIG. 5, the reflected light travels from the surface of the window 31a to the depression 310, as indicated by the solid-line arrow F12. The reflected light travels via the opening 311 of the depression 310 into the interior of the depression 310 and travels directly to the extending surface 315 of the depression 310. The light indicated by the solid-line arrow F1 and the reflected light indicated by the solid-line arrow F12 pass through the space inside the sealing member 400a. The laser-gas-side surface of the window 31a inclines with respect to the direction along the optical axis of the light indicated by the solid-line arrow F1, the end surface 303 is parallel to the window 31a, and the side surfaces 313 are perpendicular to the end surface 303. Therefore, when the reflected light indicated by the solid-line arrow F12 is viewed along the light indicated by the solid-line arrow F1, the reflected light indicated by the arrow F12 passes through the space between the pair of side surfaces 313 and travels to the extending surface 315, so that the travel of the reflected light from the window 31a to the side surfaces 313 is suppressed.

The imaginary line 602 extends across the normal 600 to the window 31a in the direction from the extending surface 315 toward the window 31a from the side facing the outer circumference of the window 31a toward the center axis of the window 31a. Therefore, when the extending surface 315 reflects the reflected light, the travel of the reflected light to part of the surface of the ring member 501 and part of the inner circumferential surface of the fixing member 503 is suppressed. In the present embodiment, since the window holder 300a having the extending surface 315 is made of metal, the reflected light is reflected off the extending surface 315. Furthermore, since the extending surface 315 inclines as described above, the reflected light is reflected off the extending surface 315 toward the window 31a and incident on the window 31a via the space inside the sealing member 400a. In addition, since the extending surface 315 inclines as described above, the reflected light travels in the direction from the extending surface 315 toward the window 31a across the normal 600 from the side facing the outer circumference of the window 31a toward the center axis C of the window 31a, and passes through the window 31a, as indicated by the arrow F13. The reflected light travels toward an opposite-side area. The opposite-side area is located on a side across the light irradiated position indicated by the arrow F1 on the laser-gas-side surface of the window 31a from the reflection-side area, which is located on the side toward which the light reflected off the window 31a travels. The extending surface 315 thus suppress the travel of the reflected light traveling from the laser-gas-side surface of the window 31a to the purge-gas-side surface thereof in the reflection-side area from the side facing the center axis C of the window 31a toward the outer circumference of the window 31a. The travel of the reflected light to a portion of the surface of the ring member 501 and a portion of the inner circumferential surface of the fixing member 503, which are both located in the reflection-side area, is therefore suppressed by a greater degree than in a case where the extending surface 315 is not formed. The portion of the surface of the ring member 501 and the portion of the inner circumferential surface of the fixing member 503, which are both located in the reflection-side area, are located on the side opposite from the direction in which the reflected light travels. In addition, since the reflected light indicated by the solid-line arrow F13 is reflected off the extending surface 315 as described above, the travel of the reflected light from the extending surface 315 to the side surfaces 313 is suppressed.

3.3 Effects and Advantages

In the gas laser apparatus 100 according to the present embodiment, the sealing member 400a is disposed so as to be in intimate contact with the window 31a and the end surface 303 of the window holder 300a and is further disposed so as to surround the opening 305. The extending surface 315 is located on the side toward which the light reflected off the window 31a travels, is continuous with the end surface 303 and extends in a direction away from the window 31a, and is irradiated with the reflected light. The imaginary line 602 extends across the normal 600 to the window 31a in the direction from the extending surface 315 toward the window 31a from the side facing the outer circumference of the window 31a toward the center axis of the window 31a.

Members disposed around the outer circumference of the window 31a are typically disposed so as not to block the light passing through the window 31a. In the present embodiment, the members include the ring member 501 and the fixing member 503. In this state, when the extending surface 315 reflects the reflected light, the travel of the reflected light to a portion of the surface of the ring member 501 and a portion of the inner circumferential surface of the fixing member 503 is suppressed. When the travel of the reflected light is suppressed, the reflection of the reflected light off the portion of the surface of the ring member 501 and the portion of the inner circumferential surface of the fixing member 503 is suppressed. When the reflection of the reflected light is suppressed, the travel of the reflected light is suppressed from the portion of the surface of the ring member 501 and the portion of the inner circumferential surface of the fixing member 503 via the window 31a to a portion of the intimate contact surface, of the sealing member 400a, that is in intimate contact with the laser-gas-side surface of the window 31a. The radiation of the reflected light to the sealing member 400a over a predetermined period or longer is therefore suppressed, whereby deterioration of the sealing member 400a occurring earlier than expected can be suppressed. When the deterioration of the sealing member 400a is suppressed, a decrease in the pre-expected service life of the sealing member 400a is suppressed. A decrease in the pre-expected usable period of the gas laser apparatus 100 can therefore be suppressed.

When the deterioration of the sealing member 400a is suppressed, the service life of the sealing member 400a is extended as compared with the case where the extending surface 315 is not formed. When the service life of the sealing member 400a is extended, the usable period of the gas laser apparatus 100 can be extended with the sealing maintained in the internal space of the enclosure 30, the hollow section 301, and the space between the end surface 303 and the window 31a.

In the gas laser apparatus 100 according to the present embodiment, the extending surface 315 reflects the reflected light in such a way that the reflected light is incident on the window 31a across the normal 600 from the side facing the outer circumference of the window 31a toward the center axis C of the window 31a. Deterioration of the sealing member 400a occurring earlier than expected can thus be suppressed as compared with a case where the extending surface 315 does not reflect the reflected light as described above.

Out of the reflected light reflected off the extending surface 315 and traveling through the interior of the window 31a, part of the reflected light may be reflected off the purge-gas-side surface of the window 31a toward the laser-gas-side surface of the window 31a. Part of the reflected light traveling to the laser-gas-side surface of the window 31a may be reflected off the laser-gas-side surface of the window 31a toward the purge-gas-side surface of the window 31a. When the reflection described above is repeated, the intensity of the reflected light traveling through the interior of the window 31a lowers. In the present embodiment, in which the reflected light passing through the window 31a returns to a portion of the surface of the ring member 501 and a portion of the inner circumferential surface of the fixing member 503, which are both located on the side facing the outer circumference of the window 31a in the reflection-side area as described above, the amount of reflected light reflected off the portions in the reflection-side area may be greater than the amount in Comparative Example. The number of actions of the reflection off the window 31a is therefore greater than the number in Comparative Example because of the presence of the inclining extending surface 315, which reflects the reflected light as described above. The intensity of the reflected light traveling to the sealing member 400a in the present embodiment is therefore smaller than the intensity of the reflected light traveling to the sealing member 400a in Comparative Example. With the intensity of the reflected light reduced, even when the reflected light reflected off the extending surface 315 travels from the interior of the window 31a to the sealing member 400a and is radiated to the sealing member 400a, the deterioration of the sealing member 400a occurring earlier than expected can be suppressed.

The extending surface 315 may be polished for better reflection. A reflective film formed of a film on which metal, such as silver or aluminum, is plated to a small thickness may be disposed at the extending surface 315. The extending surface 315 may reflect the reflected light toward the inner circumferential surface of the hollow section 301 of the window holder 300a.

Other embodiments and variations thereof will be described below. In each of the embodiments and the variations thereof, a configuration that is not particularly described is the same as the corresponding configuration in the first embodiment. The embodiments and the variations thereof will each be described with reference to the side facing the window 31a and the window holder 300a, but the window 31b and the window holder 300b in each of the embodiments and the variations thereof have the same configurations of the window 31a and the window holder 300a in each of the embodiments and the variations thereof and can provide the same effects and advantages.

4. Description of Gas Laser Apparatus According to Second Embodiment

The configuration of the gas laser apparatus 100 according to a second embodiment will next be described. The same components as those described above have the same reference characters, and duplicate description of the same components will be omitted unless otherwise particularly described.

4.1 Configuration

Figure 7:
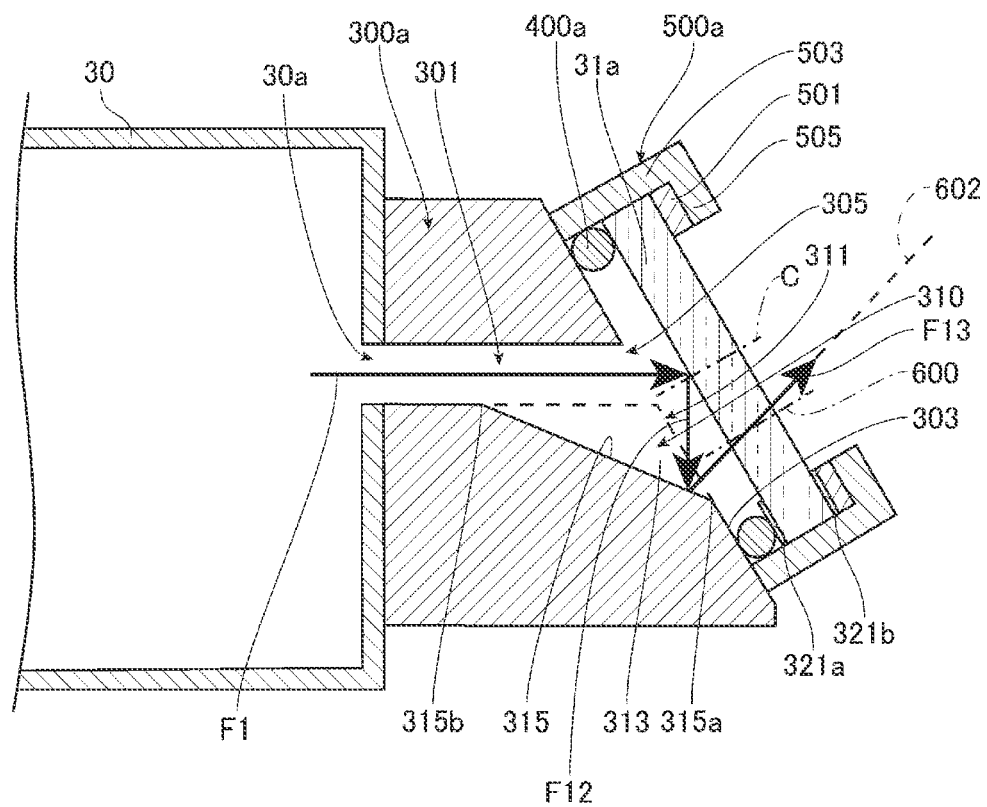
FIG. 7 shows an example of schematic configurations of the window, the window holder, and therearound on the side facing the output coupling mirror in a second embodiment.

FIG. 7 shows an example of schematic configurations of the window 31a, the window holder 300a, and thereabout in the present embodiment. In FIG. 7, the window 31a and the window holder 300a are each shown in the form of vertical cross-section.

The configuration of the window 31a in the second embodiment differs from the configuration of the window 31a in the first embodiment, and the other configurations in the second embodiment are the same as those in the first embodiment. The gas laser apparatus 100 according to the present embodiment further includes films 321a and 321b in addition to the configuration of the gas laser apparatus 100 according to the first embodiment. The films 321a and 321b are part of the configuration of the window 31a.

The film 321a is a first film disposed at the contact surface, of the laser-gas-side surface of the window 31a, that is in contact with the sealing member 400a. This film 321a is disposed at the portion, of the contact surface, toward which the reflected light reflected off the window 31a travels, and the portion corresponds to a portion, of the laser-gas-side surface of the window 31a, that is located in the reflection-side area. The film 321a is in contact with a portion of the sealing member 400a located in the reflection-side area. The film 321a is a reflection film that is primarily made of aluminum and reflects at least part of light having the same wavelength as that of the reflected light indicated by the arrow F13 toward the purge-gas-side surface of the window 31a and the outer circumference surface of the window 31a. The film 321a is disposed, for example, by vapor deposition. The film 321a preferably has a thickness of about 200 nm.

The film 321b is a second film disposed at the contact surface, of the purge-gas-side surface of the window 31a, that is in contact with the ring member 501. This film 321b is disposed at the portion, of the contact surface, toward which the reflected light reflected off the window 31a travels, and the portion corresponds to a portion, of the purge-gas-side surface of the window 31a, that is located in the reflection-side area. The film 321b is in contact with a portion of the ring member 501 located in the reflection-side area. The film 321b is an absorptive film that is primarily made of aluminum oxide and absorbs at least part of the light having the same wavelength as that of the reflected light indicated by the arrow F13. The film 321b is disposed, for example, by vapor deposition. The film 321b preferably has a thickness of about 200 nm.

4.2 Effects and Advantages

Out of the reflected light reflected off the extending surface 315 and traveling through the interior of the window 31a, part of the reflected light may be reflected off the laser-gas-side surface of the window 31a toward the purge-gas-side surface of the window 31a, as described above. In addition, part of the reflected light traveling to the purge-gas-side surface of the window 31a may be reflected off the purge-gas-side surface of the window 31a toward the laser-gas-side surface of the window 31a. The light described above is light having the same wavelength as that of the reflected light indicated by the arrow F13, and at least part of the light is repeatedly reflected inside the window 31a.

The film 321a at the laser-gas-side surface of the window 31a is a reflective film and therefore reflects the light traveling to the film 321a out of the reflected light repeatedly undergoing the reflection described above toward the outer circumferential surface of the window 31a, the film 321b at the purge-gas-side surface of the window 31a, and a portion of the purge-gas-side surface of the window 31a. The portion of the purge-gas-side surface is the area, of the purge-gas-side surface, where the ring member 501 is not disposed.

In addition, the film 321b at the purge-gas-side surface of the window 31a absorbs the light from the laser-gas-side surface of the window 31a or the light from the film 321a, which is a reflective film, out of the reflected light repeatedly undergoing the reflection described above.

Therefore, in the gas laser apparatus 100 according to the present embodiment, the film 321a suppresses radiation of the reflected light to the sealing member 400a, whereby deterioration of the sealing member 400a occurring earlier than expected is further suppressed. When the deterioration of the sealing member 400a is suppressed, a decrease in the pre-expected service life of the sealing member 400a is further suppressed. A decrease in the pre-expected usable period of the gas laser apparatus 100 can therefore be further suppressed. The film 321b also provides the same effects and advantages as those provided by the film 321a.

As a first variation of the present embodiment, one of the film 321a at the laser-gas-side surface of the window 31a and the film 321b at the purge-gas-side surface of the window 31a may be a reflective film, and the other may be an absorptive film. For example, when the film 321a at the laser-gas-side surface of the window 31a is an absorptive film, the absorptive film absorbs at least part of the light traveling from the window 31a to the sealing member 400a. For example, when the film 321b at the purge-gas-side surface of the window 31a is a reflective film, the reflective film reflects at least part of the light to the laser-gas-side surface of the window 31a, which is the surface where the sealing member 400a is disposed, and to the outer circumferential surface of the window 31a. The light described above is light having the same wavelength as that of the reflected light indicated by the arrow F13.

As a second variation of the present embodiment, the film 321a at the laser-gas-side surface of the window 31a and the film 321b at the purge-gas-side surface of the window 31a may both be reflective films or absorptive films.

As a third variation of the present embodiment, the film 321a at the laser-gas-side surface of the window 31a may be disposed over the entire surface in contact with the sealing member 400a out of the laser-gas-side surface of the window 31a. The film 321a is therefore disposed in the shape of a ring, as the ring-shaped sealing member 400a is.

As a fourth variation of the present embodiment, the film 321b at the purge-gas-side surface of the window 31a may be disposed over the entire surface in contact with the ring member 501 out of the purge-gas-side surface of the window 31a. The film 321b is therefore disposed in the shape of a ring, as the ring member 501 is.

Figure 8:
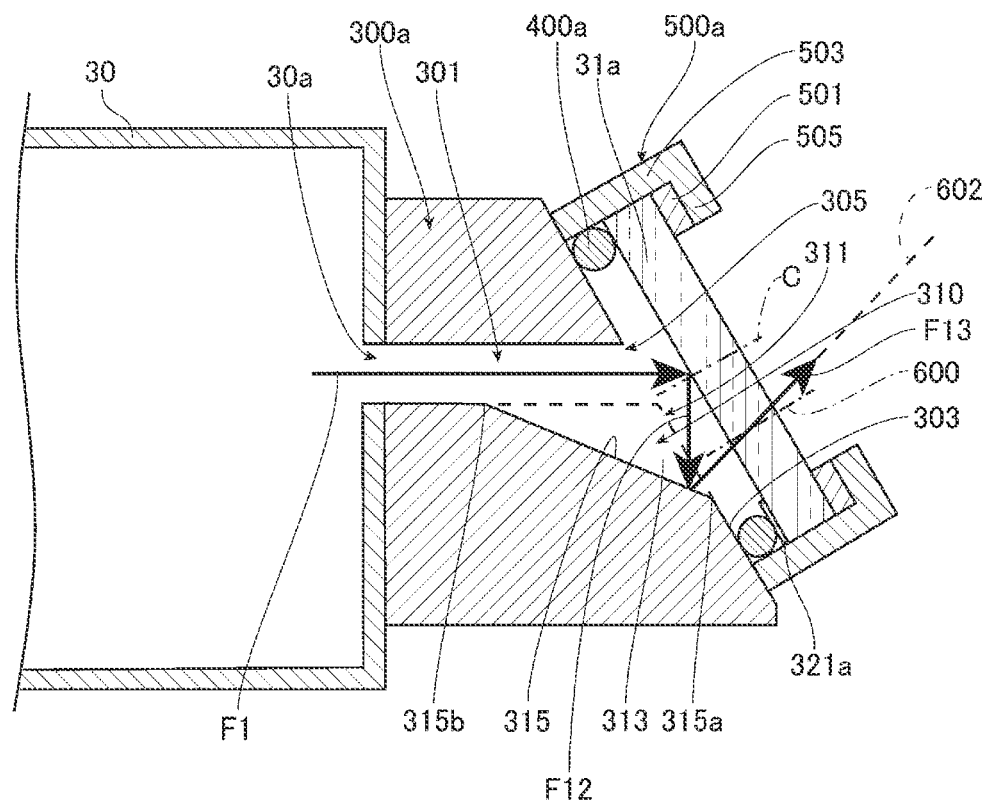
FIG. 8 shows an example of schematic configurations of the window, the window holder, and therearound in a variation of the second embodiment.

As a fifth variation of the present embodiment, the film 321b may not be disposed at the purge-gas-side surface of the window 31a, but only the film 321a may be disposed at the laser-gas-side surface of the window 31a, as shown in FIG. 8. In this case, the film 321a may be a reflective or absorptive film.

Figure 9:
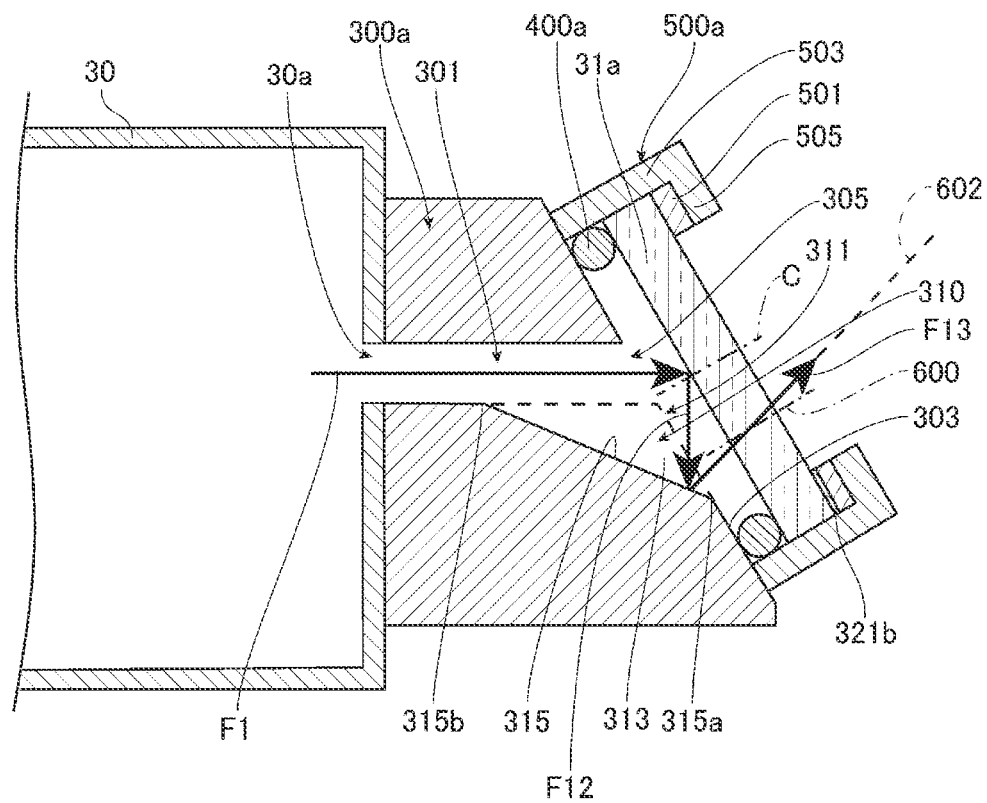
FIG. 9 shows an example of schematic configurations of the window, the window holder, and therearound in another variation of the second embodiment.

As a sixth variation of the present embodiment, the film 321a may not be disposed at the laser-gas-side surface of the window 31a, but only the film 321b may be disposed at the purge-gas-side surface of the window 31a, as shown in FIG. 9. In this case, the film 321b is an absorptive film.

As a seventh variation of the present embodiment, the reflective film may be a dielectric multilayer film. The absorptive film may instead be a blackened film.

The second embodiment and the variations thereof have been described with reference to the case where films are used, but not necessarily. For example, a plate-shaped reflective member may be disposed in place of the reflective film, or a plate-shaped absorptive member may be disposed in place of the absorptive film.

5. Description of Gas Laser Apparatus According to Third Embodiment

The configuration of the gas laser apparatus 100 according to a third embodiment will next be described. The same components as those described above have the same reference characters, and duplicate description of the same components will be omitted unless otherwise particularly described.

5.1 Configuration

Figure 10:
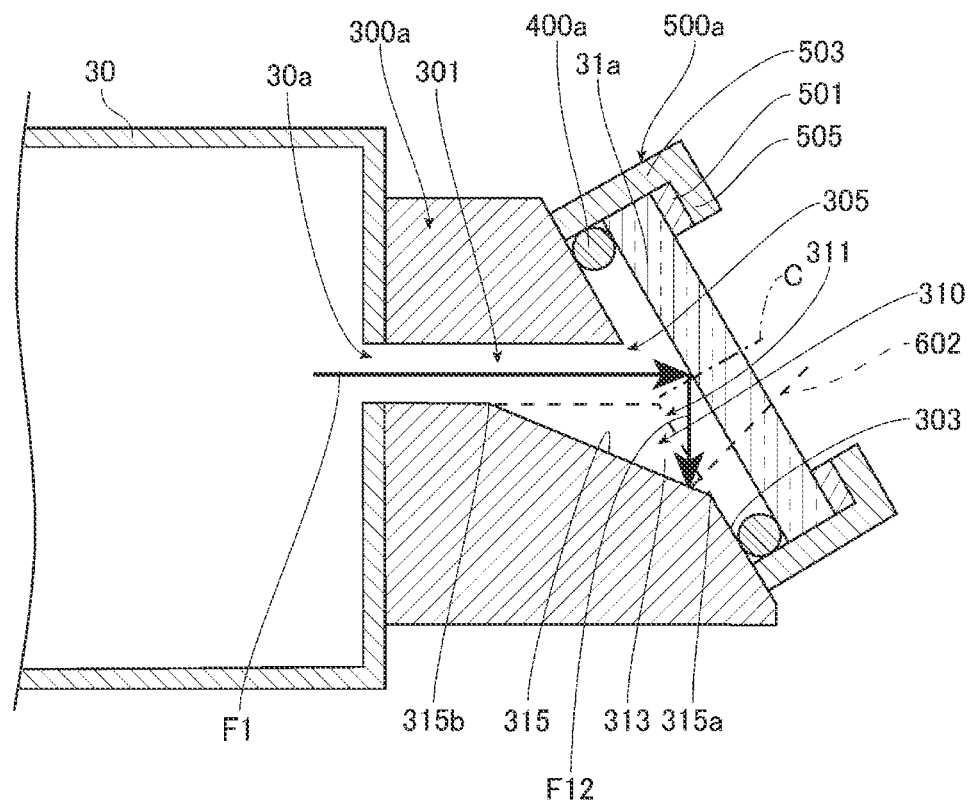
FIG. 10 shows an example of schematic configurations of the window, the window holder, and therearound on the side facing the output coupling mirror in a third embodiment.

FIG. 10 shows an example of schematic configurations of the window 31a, the window holder 300a, and therearound in the present embodiment. In FIG. 10, the window 31a and the window holder 300a are each shown in the form of vertical cross-section.

In the gas laser apparatus 100 according to the present embodiment, the configuration of the window holder 300a differs from the configuration of the window holder 300a in the first embodiment in that the window holder 300a in the present embodiment absorbs the reflected light.

Specifically, in the present embodiment, blackening plating is performed on the extending surface 315, so that the extending surface 315 is an absorptive surface that absorbs the reflected light traveling from the window 31a to the extending surface 315. The extending surface 315 converts a large portion of the reflected light into heat. The heat is dissipated out of the window holder 300a.

5.2 Effects and Advantages

In the gas laser apparatus 100 according to the present embodiment, the extending surface 315 absorbs the reflected light from the window 31a. Therefore, the travel of the reflected light from the extending surface 315 to the window 31a is suppressed, the radiation of the light traveling from the window 31a to the sealing member 400a is suppressed by a greater degree, whereby deterioration of the sealing member 400a occurring earlier than expected is further suppressed. When the deterioration of the sealing member 400a is suppressed, a decrease in the pre-expected service life of the sealing member 400a is further suppressed. A decrease in the pre-expected usable period of the gas laser apparatus 100 can therefore be further suppressed.

In addition, since the window holder 300a has the extending surface 315 that is an absorptive surface, the number of parts can be reduced as compared with a case where a separate member having an absorptive surface is disposed at the extending surface 315.

6. Description of Gas Laser Apparatus According to Fourth Embodiment

The configuration of the gas laser apparatus 100 according to a fourth embodiment will next be described. The same components as those described above have the same reference characters, and duplicate description of the same components will be omitted unless otherwise particularly described.

6.1 Configuration

Figure 11:
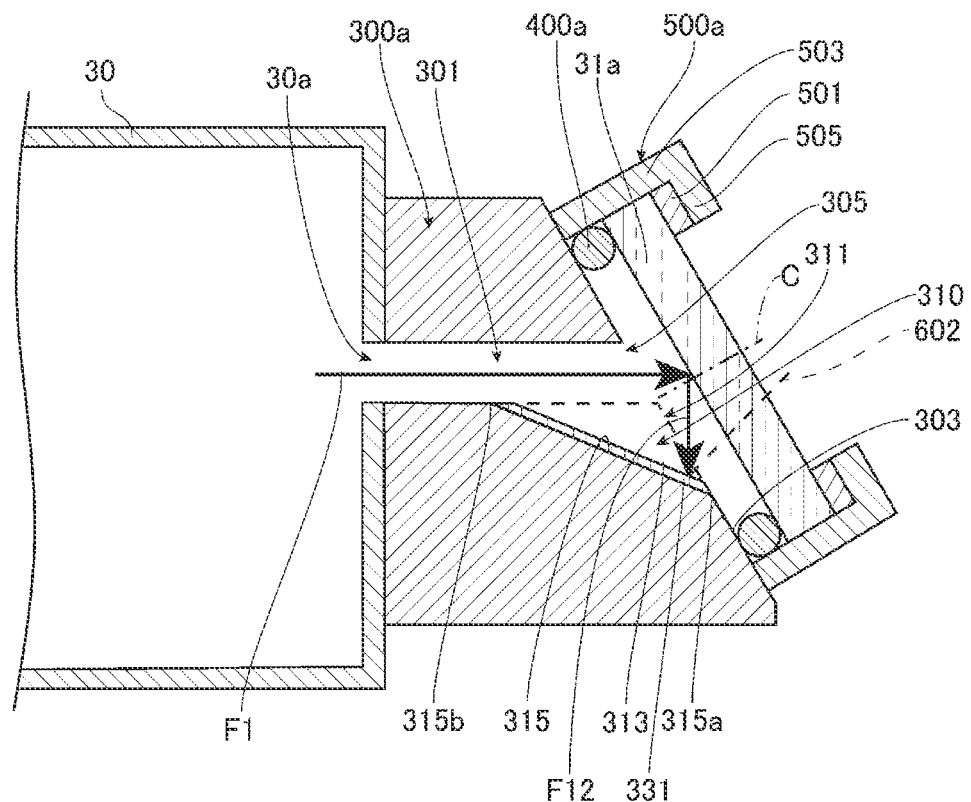
FIG. 11 shows an example of schematic configurations of the window, the window holder, and therearound on the side facing the output coupling mirror in a fourth embodiment.

FIG. 11 shows an example of schematic configurations of the window 31a, the window holder 300a, and therearound in the present embodiment. In FIG. 11, the window 31a and the window holder 300a are each shown in the form of vertical cross-section.

In the gas laser apparatus 100 according to the present embodiment, the configuration of the window holder 300a differs from the configuration of the window holder 300a in the third embodiment in that the window holder 300a in the present embodiment further includes an absorptive member 331 in addition to the configuration of the window holder 300a in the third embodiment.

The absorptive member 331 is a plate-shaped member and is disposed at the extending surface 315. The absorptive member 331 is layered on the entire extending surface 315. The absorptive member 331 is disposed in the depression 310. The absorptive member 331 is primarily made of aluminum oxide and absorbs the reflected light traveling from the window 31a to the absorptive member 331. The absorptive member 331 preferably has a thickness of about 0.3 mm. The absorptive member 331 may be formed of a blackened member.

6.2 Effects and Advantages

In the gas laser apparatus 100 according to the present embodiment, the absorptive member 331 absorbs the reflected light from the window 31a. Therefore, the travel of the reflected light from the absorptive member 331 to the window 31a is suppressed, the radiation of the light traveling from the window 31a to the sealing member 400a is suppressed by a greater degree, whereby deterioration of the sealing member 400a occurring earlier than expected is further suppressed. When the deterioration of the sealing member 400a is suppressed, a decrease in the pre-expected service life of the sealing member 400a is further suppressed. A decrease in the pre-expected usable period of the gas laser apparatus 100 can therefore be further suppressed.

In addition, the fact that the absorptive member 331 is a member separate from the window holder 300a can suppress the trouble to apply blackening plating to the window holder 300a.

The absorptive member 331 may be disposed at the reflected light irradiated position on the extending surface 315. The absorptive member 331 may further be disposed at the side surfaces 313 in the case where the light from the window 31a travels to the side surfaces 313.

In the gas laser apparatus 100 according to the present embodiment, the entire window holder 300a having the side surfaces 313 and the extending surface 315 may be configured as the absorptive member 331.

7. Description of Gas Laser Apparatus According to Fifth Embodiment

The configuration of the gas laser apparatus 100 according to a fifth embodiment will next be described. The same components as those described above have the same reference characters, and duplicate description of the same components will be omitted unless otherwise particularly described.

7.1 Configuration

Figure 12:
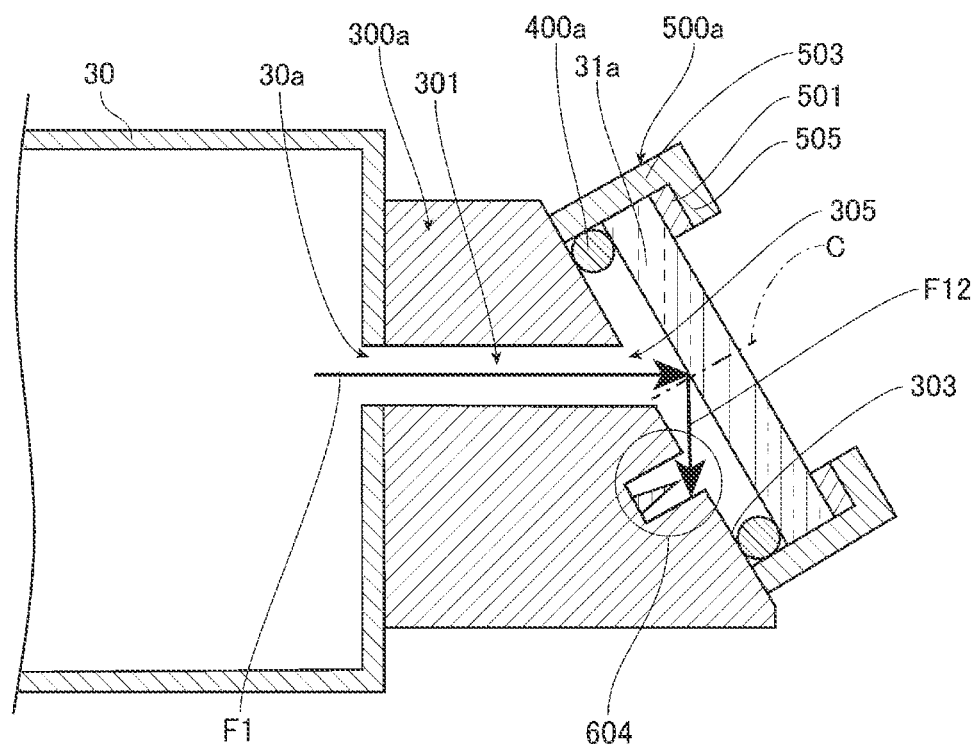
FIG. 12 shows an example of schematic configurations of the window, the window holder, and therearound on the side facing the output coupling mirror in a fifth embodiment.
Figure 13:
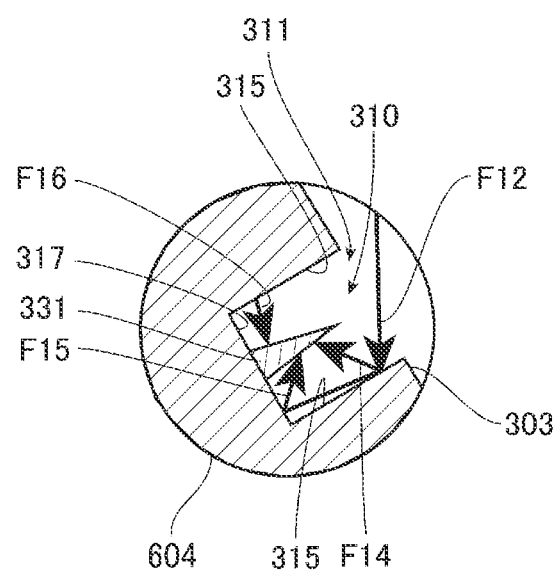
FIG. 13 is a diagrammatic view of an area surrounded by a solid-line circle in a depression shown in FIG. 12.

FIG. 12 shows an example of schematic configurations of the window 31a, the window holder 300a, and therearound in the present embodiment. In FIG. 12, the window 31a and the window holder 300a are each shown in the form of vertical cross-section. FIG. 13 is an enlarged diagrammatic view of an area surrounded by a solid-line circle 604 shown in FIG. 12.

In the gas laser apparatus 100 according to the present embodiment, the configuration of the depression 310 differs from the depression 310 in the fourth embodiment.

Unlike the depression 310 in the fourth embodiment, the depression 310 in the present embodiment is not depressed from the end surface 303 toward the hollow section 301, does not communicate with the hollow section 301, but is depressed at a portion of the end surface 303.

The extending surface 315 in the present embodiment is the side surface of the depression 310. The extending surface 315 is disposed around the center axis of a bottom surface 317 along the entire circumference thereof. The extending surface 315 is in non-parallel to the laser-gas-side surface of the window 31a.

The bottom surface 317 is continuous with the extending surface 315. The bottom surface 317 faces the window 31a. The end surface 303 is parallel to the laser-gas-side surface of the window 31a. The absorptive member 331 is disposed at the bottom surface 317.

The extending surface 315 and the area, of the bottom surface 317, where the absorptive member 331 is not disposed, are processed to a surface roughness Ra of about 1.6. An area of the extending surface 315 reflects a part of the light reflected off the window 31a toward the absorptive member 331 and reflects another part of the reflected light to another area of the extending surface 315. The extending surface 315 reflects the remainder of the reflected light to the bottom surface 317. The bottom surface 317 reflects a part of the light reflected off the extending surface 315 toward the absorptive member 331 and reflects the remainder of the light reflected off the extending surface 315 toward the extending surface 315.

The absorptive member 331 in the present embodiment is a cone-shaped member and is disposed at a portion of the bottom surface 317. The front end of the absorptive member 331 is located at a position shifted from the opening 311 toward the bottom surface 317 and is located in the depression 310. The absorptive member 331 is primarily made, for example, of aluminum oxide. The absorptive member 331 may be formed of a blackened member. The absorptive member 331 absorbs the reflected light traveling from the window 31a to the absorptive member 331 via the extending surface 315. The absorptive member 331 absorbs the reflected light traveling from an area of the extending surface 315 to the absorptive member 331 via another area of the extending surface 315. The absorptive member 331 further absorbs the reflected light traveling from the extending surface 315 to the absorptive member 331 via the bottom surface 317.

7.2 Effects and Advantages

The reflected light from the window 31a travels from the laser-gas-side surface of the window 31a to the depression 310, as indicated by the solid-line arrow F12. The reflected light further travels via the opening 311 of the depression 310 to the interior of the depression 310 and travels directly to the extending surface 315 of the depression 310, as indicated by the solid-line arrow F12. A part of the reflected light is reflected off the extending surface 315 toward the absorptive member 331, as indicated by a solid-line arrow F14. Another part of the reflected light is reflected off the extending surface 315 toward the bottom surface 317 and further reflected off the bottom surface 317 toward the absorptive member 331, as indicated by a solid-line arrow F15. Still another part of the reflected light is reflected off an area of the extending surface 315 toward another area of the extending surface 315 and is further reflected off the other area of the extending surface 315 toward the absorptive member 331, as indicated by a solid-line arrow F16. A part of the remainder of the reflected light is reflected off the bottom surface 317 toward the extending surface 315 and is further reflected off the extending surface 315 toward the absorptive member 331. The reflected light is thus repeatedly reflected between the extending surface 315 and the bottom surface 317, which suppresses the travel of the reflected light from the internal space of the depression 310 to the space which is outside the depression 310 and where the window 31a is disposed, and absorbed by the absorptive member 331.

In the gas laser apparatus 100 according to the present embodiment, the absorptive member 331 absorbs the reflected light traveling from the window 31a to the absorptive member 331 via the extending surface 315. The absorptive member 331 also absorbs the reflected light traveling from the extending surface 315 to the absorptive member 331 via the bottom surface 317. Therefore, the travel of the reflected light from the absorptive member 331 to the window 31a is suppressed, the radiation of the light traveling from the window 31a to the sealing member 400a is suppressed by a greater degree, whereby deterioration of the sealing member 400a occurring earlier than expected is further suppressed. When the deterioration of the sealing member 400a is suppressed, a decrease in the pre-expected service life of the sealing member 400a is further suppressed. A decrease in the pre-expected usable period of the gas laser apparatus 100 can therefore be further suppressed.

An area of the extending surface 315, to which reflected light from the window 31a directly travels, does not need to reflect the reflected light to the bottom surface 317 or another area of the extending surface 315, to which the reflected light from the window 31a does not directly travel, and the reflected light may entirely be reflected directly to the sealing member 400a. The depression 310 may be depressed from the end surface 303 toward the hollow section 301 and may communicate with the hollow section 301, as in the case of the depression 310 in the fourth embodiment. The reflected light reflected off the extending surface 315 can travel to the inner circumferential surface of the hollow section 301 of the window holder 300a, can be reflected off the inner circumferential surface, and can return to the internal space of the enclosure 30.

The extending surface 315 and the bottom surface 317 may be coated with a film that increases the absorption of light, or may be surface-treated to increase the absorption of light. For example, an absorptive film made primarily of aluminum oxide may be disposed at the extending surface 315 and the bottom surface 317.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined. The terms used throughout the present specification and the appended claims should be interpreted as non-limiting terms. For example, the term "include" or "included" should be construed as "does not necessarily include only what is described". The term "have" should be construed as "does not necessarily have only what is described". Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of any thereof and any other than A, B, and C.

What is claimed is:

1. A gas laser apparatus comprising:
   an enclosure having an internal space where light is generated by laser gas excitation and a hole via which the light from the internal space exits;
   a tubular window holder disposed at the enclosure and including a hollow section through which the light that exits via the hole passes;
   a window through which the light traveling through the hollow section passes and which is held by the window holder with a surface on which the light is incident inclining with respect to an optical axis of the light traveling through the hollow section; and
   a ring-shaped sealing member that is disposed around an opening through which the light that has traveled through the hollow section passes and that seals between the window and the window holder at a surface of the window that comes into contact with the laser gas,
   the window holder further includes a recessed portion having an extending surface as a bottom surface onto which reflected light reflected by the window is irradiated among the light traveling to the window through the opening,
   the recessed portion is recessed from an end surface of the window holder facing the window and communicates with the hollow section, and
   the extending surface is formed between the end surface and an inner circumferential surface of the hollow section, including one end continuing to the end surface and the other end continuing to the inner circumferential surface of the hollow section, and is inclined with respect to the optical axis of the light traveling through the hollow section such that the one end is located farther away from the optical axis of the light than the other end.

2. The gas laser apparatus according to claim 1, wherein the extending surface reflects the reflected light.

3. The gas laser apparatus according to claim 2, wherein the window further includes a film that is disposed at a contact surface, of the window, in contact with the sealing member and reflects at least a part of light having the same wavelength as a wavelength of the reflected light.

4. The gas laser apparatus according to claim 3, further comprising a ring member disposed at the window on a side across the window from the sealing member, and
   the window includes a film that is disposed at a contact surface, of the window, in contact with the ring member and absorbs at least a part of light having the same wavelength as a wavelength of the reflected light.

5. The gas laser apparatus according to claim 3, further comprising a ring member disposed at the window on a side across the window from the sealing member, and
   the window includes a film that is disposed at a contact surface, of the window, in contact with the ring member and reflects at least a part of light having the same wavelength as a wavelength of the reflected light.

6. The gas laser apparatus according to claim 2, wherein the window further includes a film that is disposed at a contact surface, of the window, in contact with the sealing member and absorbs at least a part of the light having the same wavelength as a wavelength of the reflected light.

7. The gas laser apparatus according to claim 6, further comprising a ring member disposed at the window on a side across the window from the sealing member, and
   the window includes a film that is disposed at a contact surface, of the window, in contact with the ring member and absorbs at least a part of light having the same wavelength as a wavelength of the reflected light.

8. The gas laser apparatus according to claim 6, further comprising a ring member disposed at the window on a side across the window from the sealing member, and
   the window includes a film that is disposed at a contact surface, of the window, in contact with the ring member and reflects at least a part of the light having the same wavelength as a wavelength of the reflected light.

9. The gas laser apparatus according to claim 2, further comprising a ring member disposed at the window on a side across the window from the sealing member, and
   the window includes a film that is disposed at a contact surface, of the window, in contact with the ring member and absorbs light having the same wavelength as a wavelength of the reflected light.

10. The gas laser apparatus according to claim 2, a reflective film formed of a film on which metal is disposed on the extending surface.

11. The gas laser apparatus according to claim 1, wherein the window holder absorbs the reflected light.

12. The gas laser apparatus according to claim 11, wherein the extending surface absorbs the reflected light.

13. The gas laser apparatus according to claim 12, wherein the extending surface is an absorptive surface having undergone blackening plating.

14. The gas laser apparatus according to claim 11, the extending surface is provided with a coating that improves light absorption.

15. The gas laser apparatus according to claim 1, wherein the window holder further includes an absorptive member disposed at the extending surface, and
   the absorptive member absorbs the reflected light.

16. The gas laser apparatus according to claim 1, the extending surface is a plane.

17. The gas laser apparatus according to claim 1, the extending surface has a rectangular shape.

18. An electronic device manufacturing method comprising:
   causing laser light outputted from a gas laser apparatus to enter an exposure apparatus, the gas laser apparatus including
an enclosure having an internal space where light is generated by laser gas excitation and a hole via which the light from the internal space exits,
a tubular window holder disposed at the enclosure and including a hollow section through which the light that exits via the hole passes,
a window through which the light traveling through the hollow section passes and which is held by the window holder with a surface on which the light is incident inclining with respect to an optical axis of the light traveling through the hollow section, and
a ring-shaped sealing member that is disposed around an opening through which the light that has traveled through the hollow section passes and that seals between the window and the window holder at a surface of the window that comes into contact with the laser gas,
the window holder further includes a recessed portion having an extending surface as a bottom surface on which reflected light reflected by the window is irradiated among the light traveling to the window through the opening,
the recessed portion is recessed from an end surface of the window holder facing the window and communicates with the hollow section, and
the extending surface is formed between the end surface and an inner circumferential surface of the hollow section, including one end continuing to the end surface and the other end continuing to the inner circumferential surface of the hollow section, and is inclined with respect to the optical axis of the light traveling through the hollow section such that the one end is located farther away from the optical axis of the light than the other end; and
causing a light sensitive substrate to be exposed to the laser light in the exposure apparatus to manufacture electronic devices.

* * * * *